US012467751B2

(12) United States Patent
Wang

(10) Patent No.: US 12,467,751 B2
(45) Date of Patent: Nov. 11, 2025

(54) GYROSCOPE AND CHARGING DEVICE

(71) Applicant: SHENZHEN YIKE INNOVATION TECHNOLOGY CO., LTD., Shenzhen (CN)

(72) Inventor: Jie Wang, Shenzhen (CN)

(73) Assignee: SHENZHEN YIKE INNOVATION TECHNOLOGY CO., LTD., Shenzhen (CN)

( * ) Notice: Subject to any disclaimer, the term of this patent is extended or adjusted under 35 U.S.C. 154(b) by 279 days.

(21) Appl. No.: 18/320,913

(22) Filed: May 19, 2023

(65) Prior Publication Data

US 2024/0077311 A1 Mar. 7, 2024

(30) Foreign Application Priority Data

Sep. 2, 2022 (CN) ......................... 202211069795.2

(51) Int. Cl.
*A63H 1/00* (2019.01)
*A63H 29/20* (2006.01)
(Continued)

(52) U.S. Cl.
CPC ............... *G01C 19/10* (2013.01); *A63H 1/00* (2013.01); *A63H 29/20* (2013.01); *A63H 33/26* (2013.01);
(Continued)

(58) Field of Classification Search
CPC ........... A63H 1/00; A63H 29/20; A63H 33/26
See application file for complete search history.

(56) References Cited

U.S. PATENT DOCUMENTS 4,713,039 A * 12/1987 Wong ........................ A63H 1/24 446/233
5,683,284 A 11/1997 Christen
(Continued)

FOREIGN PATENT DOCUMENTS

CN 2083949 U 9/1991
CN 2114494 U 9/1992
(Continued)

OTHER PUBLICATIONS

Second Office Action issued in counterpart Chinese Patent Application No. 202211069795.2, dated Feb. 22, 2024.
(Continued)

*Primary Examiner* — John A Ricci
(74) *Attorney, Agent, or Firm* — Westbridge IP LLC

(57) ABSTRACT

Disclosed are a gyroscope and a charging device. The gyroscope includes: a casing, a motor, a circuit board and at least two tilt switches. The casing is provided with a rotation axis, the motor is fixedly mounted on the casing, an output shaft of the motor is coaxial with the rotation axis, an end of the output shaft away from the motor is located outside the casing, and the casing is rotatable around the rotation axis with the end of the output shaft away from the motor as a fulcrum. The circuit board is provided with a power supply and a current amplification circuit, the motor is connected to the power supply through the current amplification circuit. The at least two tilt switches are connected in series to the current amplification circuit for jointly controlling an on/off of the current amplification circuit.

8 Claims, 7 Drawing Sheets

(51) Int. Cl.

| | |
|---|---|
| ***A63H 33/26*** | (2006.01) |
| ***G01C 19/10*** | (2006.01) |
| ***H01H 35/02*** | (2006.01) |
| ***H03F 3/345*** | (2006.01) |
| ***H05K 1/18*** | (2006.01) |

(52) U.S. Cl.
CPC ............ *H01H 35/02* (2013.01); *H03F 3/345* (2013.01); *H05K 1/181* (2013.01)

(56) References Cited

U.S. PATENT DOCUMENTS 5,823,845 A * 10/1998 O'Berrigan ............ A63H 11/14 446/234
6,419,544 B1 * 7/2002 Parker ...................... A63H 1/00 446/236
6,607,420 B2 * 8/2003 Chung ..................... A63H 1/04 446/233
6,685,531 B1 * 2/2004 Tiefel ....................... A63H 1/00 446/256
6,773,328 B2 * 8/2004 Tiefel ....................... A63H 1/00 446/459
6,913,506 B2 * 7/2005 Tiefel ....................... A63H 1/06 446/256
7,326,156 B2 * 2/2008 Dworzan ............. A63B 21/222 482/44

FOREIGN PATENT DOCUMENTS

| | | | |
|---|---|---|---|
| CN | 2163676 | Y | 5/1994 |
| CN | 2593858 | Y | 12/2003 |
| CN | 2621081 | Y | 6/2004 |
| CN | 201791362 | U | 4/2011 |
| CN | 203694583 | U | 7/2014 |
| CN | 203916063 | U | 11/2014 |
| CN | 104707336 | A | 6/2015 |
| CN | 106730874 | A | 5/2017 |
| CN | 110233589 | A | 9/2019 |
| CN | 216873005 | U | 7/2022 |
| JP | 2004230034 | A | 8/2004 |
| JP | 2006130271 | A | 5/2006 |
| JP | 6664763 | B1 | 3/2020 |

OTHER PUBLICATIONS

Third Office Action issued in counterpart Chinese Patent Application No. 202211069795.2, dated May 14, 2024.
First Office Action issued in counterpart Chinese Patent Application No. 202211069795.2, dated Sep. 11, 2023.

* cited by examiner

GYROSCOPE AND CHARGING DEVICE

CROSS-REFERENCE TO RELATED APPLICATIONS

This application claims priority to Chinese Patent Application No. 202211069795.2, filed on Sep. 2, 2022, the entire contents of which are incorporated herein by reference.

TECHNICAL FIELD

The present disclosure relates to the technical field of gyroscopes, and in particular to a gyroscope and a charging device.

BACKGROUND

The gyroscope refers to a rigid body that rotates around a fulcrum at high speed. The gyroscope is one of the earliest entertainment tools. Nowadays, the gyroscope is still welcomed by people from all age groups.

The gyroscope in related art, after rotated by an external force, does not rotate for a long time, and will stop rotating soon due to the friction force of the rotating plane or other resistances. If the gyroscope needs to be rotated repeatedly, it needs repeatedly external forces. For gyroscope players, frequent operation not only consumes the physical strength, but also is troublesome, resulting in a very bad experience for gyroscope players. To solve this problem, a kind of electric gyroscope appears on the market, which utilizes the rotating of the motor to drive the gyroscope to continuously rotate.

However, the existing electric gyroscope switch needs to toggle or press the button on the top casing, which not only destroys the appearance of the top casing, but also is troublesome to operate. In order to make the gyroscope rotate more powerfully and for a longer time, the existing electric gyroscope often requires a motor with a larger power and a power supply with a larger capacity, which will increase the manufacturing cost.

SUMMARY

The main objective of the present disclosure is to provide a gyroscope and a charging device, aiming to ensure continuous rotating and save costs.

To achieve the above purpose, the present disclosure provides a gyroscope, including: a casing, a motor, a circuit board and at least two tilt switches.

The casing is provided with a rotation axis, and a gravity center of the casing lies on the rotation axis.

The motor is fixedly mounted on the casing, an output shaft of the motor is coaxial with the rotation axis, an end of the output shaft away from the motor is located outside the casing, and the casing is rotatable around the rotation axis with the end of the output shaft away from the motor as a fulcrum.

The circuit board is provided on the casing and can move with the casing, the circuit board is provided with a power supply and a current amplification circuit, the motor is connected to the power supply through the current amplification circuit, so that a current output by the power supply is amplified by the current amplification circuit and delivered to the motor to control the motor to operate.

The at least two tilt switches are connected in series to the current amplification circuit for jointly controlling an on/off of the current amplification circuit, the at least two tilt switches are arranged at intervals on the circuit board, each tilt switch has an off state and an on state, when the gyroscope is stationary at any angle, at least one of the tilt switches is in the off state, and when the casing is rotated, all the tilt switches are in the on state.

In an embodiment, the current amplification circuit includes a Metal-Oxide-Semiconductor Field-Effect (MOS) transistor, a plurality of resistors and a plurality of electrical connectors.

A positive pole of the power supply is electrically connected to a source of the MOS transistor through the electrical connector, one end of the plurality of tilt switches connected in series is connected to a gate of the MOS transistor through the electrical connector, another end of the plurality of tilt switches is connected to a negative pole of the power supply through the electrical connector, two ends of the resistor are respectively connected to the positive pole of the power supply and the gate of the MOS transistor through the electrical connector, and two poles of the motor are respectively connected to a drain of the MOS transistor and the negative pole of the power supply.

In an embodiment, the casing includes an upper casing and a lower casing, one end of the upper casing is provided with a driving portion, another end of the upper casing is provided with an accommodating chamber away from an opening of the driving portion, the lower casing is detachably installed in the accommodating chamber, and the motor, the power supply and the circuit board are all mounted on the lower casing.

In an embodiment, one end of the lower casing facing the driving portion is provided with a placing groove facing the opening of the driving portion, the lower casing is provided with a mounting member fixedly connected in the placing groove, one end of the mounting member facing the driving portion is provided with a mounting groove facing the opening of the driving portion, the motor is installed in the mounting groove, the circuit board is provided in the placing groove and is abutted against an end of the mounting member close to the driving portion, and the output shaft passes through and protrudes from the lower casing.

In an embodiment, the power supply is a rechargeable battery, a positive charging pin is provided on the circuit board, or a plurality of positive charging pins are provided in parallel on the circuit board;

a negative charging pin is provided on the circuit board, or a plurality of negative charging pins are provided in parallel on the circuit board; and the positive charging pin and the negative charging pin are externally connected to a charging current to charge the power supply.

In an embodiment, a plurality of fixing members fixedly connected to the lower casing are arranged between a peripheral wall of the lower casing and a peripheral wall of the mounting member, a through hole is penetrated on the fixing member, one end of the through hole penetrates through the lower casing, and the positive charging pin and the negative charging pin are respectively plugged into one of the through holes.

In an embodiment, a locating member is provided in the lower casing, a locating groove for plugging and fitting with the locating member is provided on the circuit board, and the positive charging pin and the negative charging pin are inserted into the through hole through the cooperation of the locating member and the locating groove.

In an embodiment, the end of the output shaft away from the motor is arc-shaped, or the end of the output shaft away from the motor is provided with a fulcrum sleeve, and an end of the fulcrum shaft away from the motor is arc-shaped.

The present disclosure also provides a charging device to charge the gyroscope, including: a supporting casing and a charging board. The charging board is provided in the supporting casing, and the charging board is electrically connected to the power supply and can charge the power supply.

In an embodiment, a positive contact pin and a negative contact pin are provided on the charging board, the positive contact pin and the negative contact pin are configured for correspondingly contacting with the positive charging pin and the negative charging pin on circuit board to energize the charging board and the power supply.

In an embodiment, the supporting casing includes a bottom casing and a top casing, one end of the top casing is provided with an accommodating groove, the accommodating groove is provided with an opening, the bottom casing is fixedly connected to the top casing and is covered at the opening of the accommodating groove, an end of the top casing away from the bottom casing is provided with an abutting groove, an end of the casing close to the output shaft is installed and fitted in the abutting groove, the top casing is provided with a receding groove communicated with the abutting groove at a position facing the output shaft on a bottom wall of the abutting groove, and the output shaft is inserted into the receding groove.

In an embodiment, a first mounting portion is provided on the casing, a first magnet is provided in the first mounting portion, one end of the top casing away from the abutting groove is provided with a second mounting portion at a position of the first magnet, and a second magnet is provided in the second mounting portion.

In the present disclosure, the plurality of tilt switches are provided on the circuit board at intervals to ensure that when the gyroscope is stationary at any angle, at least one tilt switch is in the off state. Only when the casing is rotated to apply a centrifugal force to all the tilt switches, can all the tilt switches be turned on, and the power supply can transmit the electric energy to make the motor work. Compared with the gyroscope in the related art, the gyroscope of the present disclosure only needs to rotate the casing to control the work of the motor without setting buttons on the casing, which can avoid setting buttons on the surface of the casing, so as to ensure the integrity of the gyroscope and make the appearance of the gyroscope more beautiful. In addition, when playing with the gyroscope, it is necessary to turn the gyroscope. By setting the plurality of tilt switches, the motor can be controlled while the gyroscope is rotated, so that the gyroscope in the present disclosure is similar to a traditional gyroscope, which can be started when it is turned, and is more convenient to operate.

By supporting the end of the output shaft of the motor on the rotating plane, the casing can rotate around the output shaft with the end of the output shaft as the fulcrum. When the casing rotates, the motor, the circuit board and the tilt switch are driven to rotate, and the plurality of tilt switches are turned on at the same time, so that the motor runs, the body of the motor is fixedly connected to the casing, and the casing is driven to rotate relative to the output shaft. That is, the casing can not only rotate around the rotation axis with the output shaft and the end of the output shaft as the fulcrum, but also can rotate relative to the output shaft driven by the motor, thereby realizing the continuous rotating of the gyroscope.

In addition, the circuit board is also provided with a current amplification circuit, and the plurality of tilt switches are connected in series in the current amplification circuit. When the gyroscope is stationary, at least one tilt switch is in the off state, and the current amplification circuit is in the off state at this time, and the power supply and the motor are not connected. When the gyroscope is rotated to provide the centrifugal force to the plurality of tilt switches, all the tilt switches are turned on, so that the current amplification circuit is turned on, and the power supply can be connected to the motor. By setting the current amplification circuit, the current output by the power supply can be amplified to meet the requirements of driving the motor, so that the motor can be driven by a smaller power supply, which saves energy and cost. In other words, on the premise of the same power supply, using the power supply connected to the motor with the current amplification circuit can drive a higher-power motor to work than the power supply connected to the motor without the current amplification circuit, which is conducive to providing the greater power for the rotating of the gyroscope. By combining the current amplification circuit and the plurality of tilt switches according to the solution of the present disclosure, it is possible to better control the on/off of the current amplification circuit.

BRIEF DESCRIPTION OF THE DRAWINGS

In order to illustrate the technical solutions in the embodiments of the present disclosure or in the related art more clearly, the following briefly introduces the accompanying drawings required for the description of the embodiments or the related art. Obviously, the drawings in the following description are only part of embodiments of the present disclosure. For those of ordinary skill in the art, other drawings can also be obtained according to the structures shown in these drawings without any creative effort.

DETAILED DESCRIPTION OF THE EMBODIMENTS

In order to facilitate understanding of the present disclosure, the present disclosure will be described more fully below with reference to the accompanying drawings. The embodiments of the present disclosure are shown in the accompanying drawings. However, the present disclosure can be implemented in many different forms and is not limited to the embodiments described herein. On the contrary, the purpose of providing these embodiments is to make the understanding of the disclosure more thorough and comprehensive.

It should be noted that when an element is "fixed" to another element, it may be directly on the other element or there may be an intervening element. When an element is "connected to" another element, it can be directly connected to the other element or intervening elements may also be provided. The terms "vertical", "horizontal," "left", "right" and similar expressions are used herein for purposes of illustration only.

Unless otherwise defined, all technical and scientific terms used herein have the same meaning as commonly understood by those skilled in the art. The terms used herein are only for the purpose of describing embodiments, and are not intended to limit the present disclosure. The term "and/or" includes any and all combinations of one or more of the associated listed items.

Figure 1:
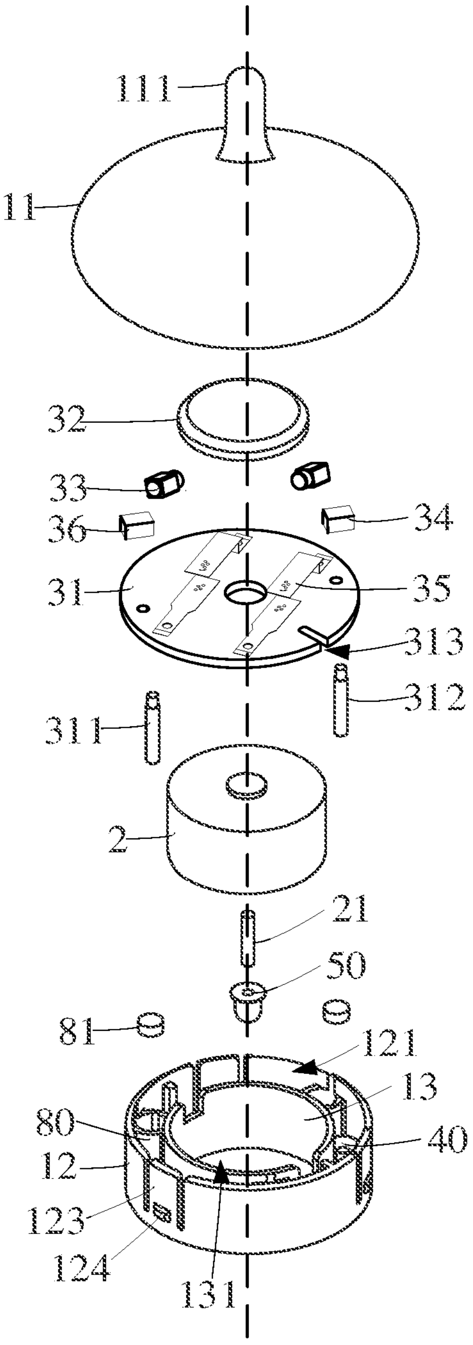
FIG. 1 is an exploded view of a gyroscope according to an embodiment of the present disclosure.
Figure 2:
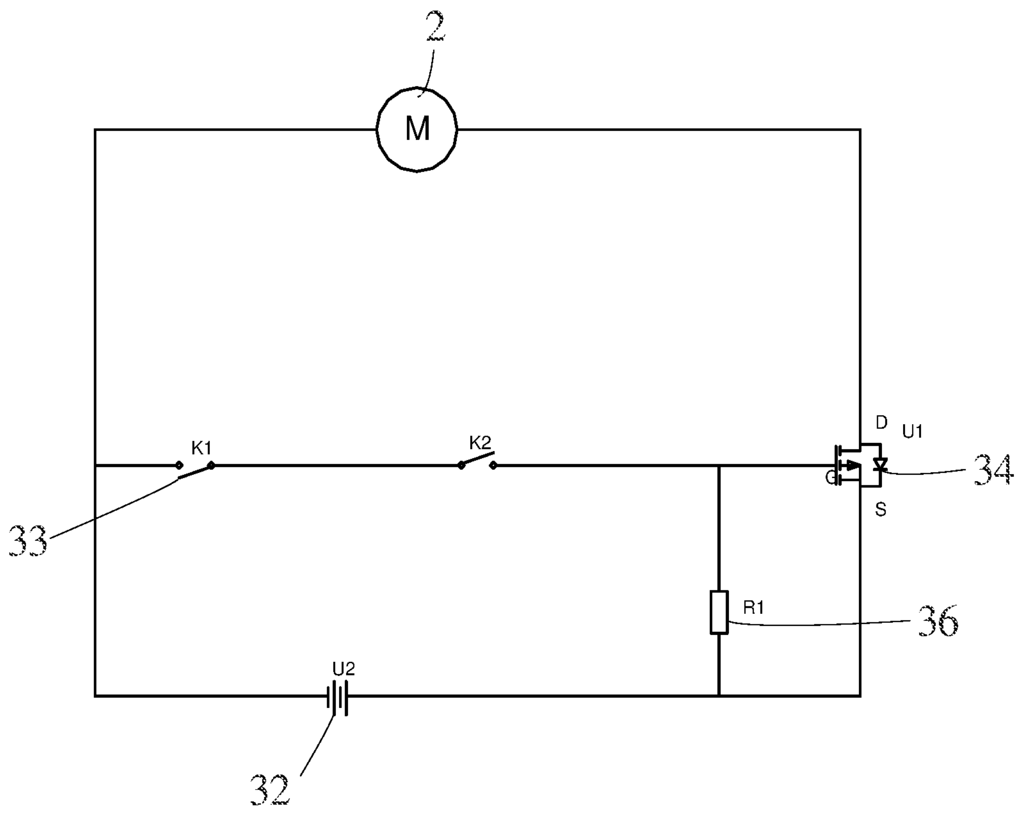
FIG. 2 is a circuit view of a current amplification circuit of a gyroscope according to an embodiment of the present disclosure.
Figure 3:
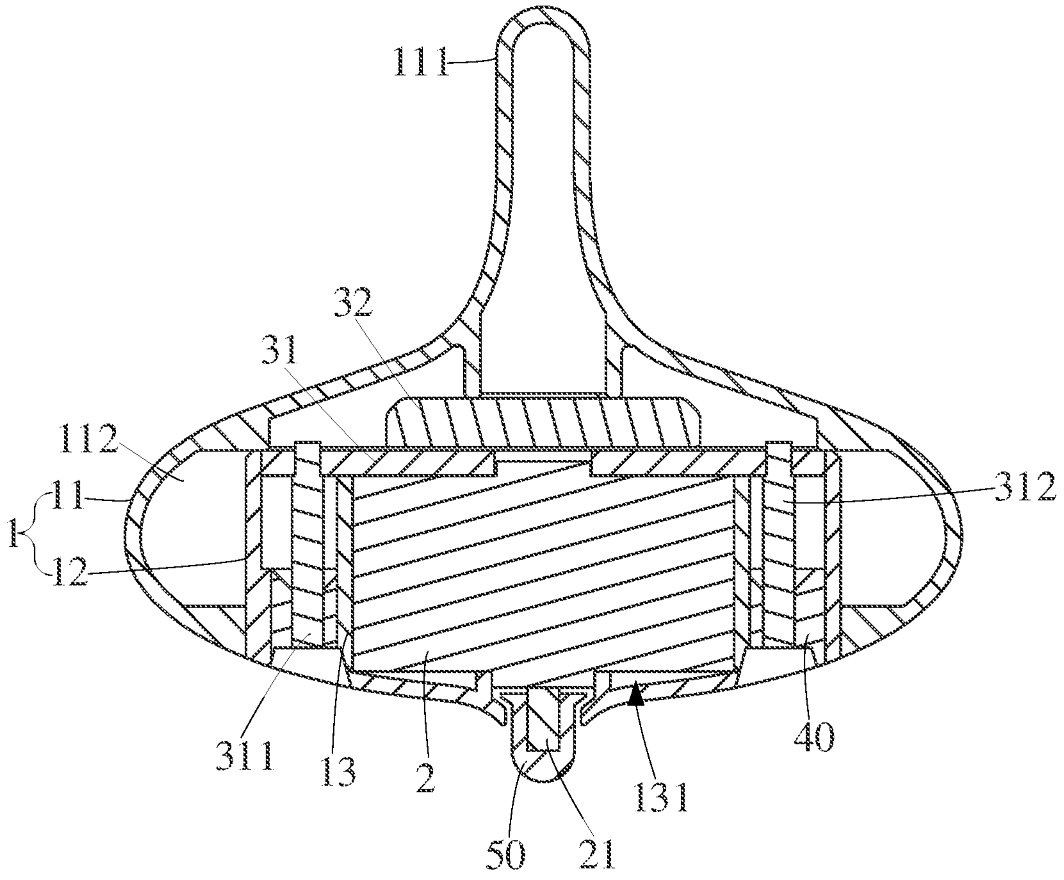
FIG. 3 is a sectional view of a gyroscope according to an embodiment of the present disclosure.

The present disclosure provides a gyroscope. In an embodiment, as shown in FIG. 1 and FIG. 2, the gyroscope includes a casing 1, a motor 2, a circuit board 31 and a tilt switch 33. The casing 1 is a main body of the gyroscope, and provides a mounting environment for the motor 2, the circuit board 31 and the tilt switch 33. As shown in FIG. 1, the casing 1 is provided with a rotation axis, and the rotation axis is the dotted line in FIG. 1. A gravity center of the casing 1 is provided on the rotation axis, and the casing 1 can rotate around the rotation axis. The motor 2 is fixedly mounted on the casing 1, and an output shaft 21 of the motor 2 is coaxial with the rotation axis. In actual production, the output shaft 21 of the motor 2 may not be completely coaxial with the rotation axis, and there is a certain error. As long as the output shaft 21 of the motor 2 is parallel to the rotation axis, and a distance between the output shaft 21 of the motor 2 and the rotating shaft 21 does not affect the rotating of the gyroscope.

An end of the output shaft 21 of the motor 2 away from the motor 2 is located outside the casing 1 and can rotate relative to the casing 1. The casing 1 can rotate around the rotation axis with the end of the output shaft 21 away from the motor 2 as a fulcrum.

The circuit board 31 is provided on the casing 1, and the circuit board 31 can rotate with the casing 1. The circuit board 31 is provided with a power supply 32 and a current amplification circuit, and the motor 2 and the power supply 32 can be connected through the amplification circuit, so that the current output by the power supply 32 is transmitted to the motor 2 after amplified by the current amplification circuit, so as to control the motor 2 to operate.

The gyroscope also includes at least two tilt switches 33, the at least two tilt switches 33 are connected in series on the amplification circuit, and can jointly control a conduction of the amplification circuit. The at least two tilt switches 33 are provided on the circuit board 31 at a preset angle interval. The tilt switch 33 has an off state and an on state. Normally, the tilt switch 33 is in the off state. Due to an internal structural characteristic, the tilt switch 33 will be in the on state.

The plurality of tilt switches 33 are arranged at intervals on the circuit board 31 to ensure that when the gyroscope is stationary at any angle, at least one tilt switch 33 is in the off state, and only when the casing 1 is rotated to apply a centrifugal force to all the tilt switches 33, the tilt switches 33 can be turned on, then the power supply 32 can transmit an electric energy to the motor 2, so that the motor 2 works. It should be noted that a placement of the tilt switch 33 on the circuit board 31 is based on a fact that it can be in the on state as soon as it is subjected to the centrifugal force generated by a rotation of the casing 1, and the tilt switch 33 cannot be reversed.

Compared with the gyroscope in the related art, the gyroscope in the present disclosure only needs to rotate the casing 1 to control the operation of the motor 2, without setting buttons on the casing 1, which can avoid the buttons provided on the surface, so as to ensure an integrity of the gyroscope, and make an appearance of the gyroscope more beautiful. In addition, when playing the gyroscope, it is necessary to turn the gyroscope. By setting the plurality of tilt switches 33, the internal current amplification circuit can be turned on while rotating the gyroscope, the motor 2 is rotated, and the gyroscope in the present disclosure can start to rotate like traditional gyroscopes and can continue to rotate until power supply 32 is out of electricity, which is more convenient to operate. It only needs to stop the gyroscope rotating with a hand when turning off, then the centrifugal force that tilt switch 33 is subjected to disappears, the tilt switches 33 are all disconnected, the amplification circuit is also disconnected, the motor 2 is disconnected from the power supply 32, and the motor 2 stops working.

By supporting the end of the output shaft 21 of the motor 2 on the rotating plane, the casing 1 can rotate around the output shaft 21 with the end of the output shaft 21 as the fulcrum. When the casing 1 rotates, the motor 2, the circuit board 31 and the tilt switch 33 are driven to rotate, and the plurality of tilt switches 33 are turned on at the same time. The motor 2 is turned on, since a main body of the motor 2 is fixedly connected to the casing 1, the casing is driven to rotate relative to the output shaft 21. The casing 1 continues to provide the centrifugal force to the tilt switch 33 when it rotates, so that the tilt switch 33 remains in the on state. That is, the casing 1 can not only rotate around the rotation axis with the output shaft 21 with the end of the output shaft 21 as the fulcrum, but the casing 1 can also rotate relative to the output shaft 21 driven by the motor 2, thereby realizing the continuous rotating of the gyroscope.

It should be noted that there is a certain frictional force f1 between the end of the output shaft 21 and the rotating plane. When the gyroscope rotates, an air resistance f2 is pressed on the casing 1. In addition, there is a force f3 and a force f4 interacted with the f3 inside the motor 2, which are generated between a rotor and a stator inside the motor 2. When an initial force is applied to the casing 1 to drive the gyroscope to rotate as a whole, although the motor 2 is started at the beginning, the initial force is relatively large, so that the casing 1 and the output shaft 21 move towards a same direction at the same time with the end of the output shaft 21 as the fulcrum. At this time, f1 is a dynamic friction force, and directions of f1 and f2 are directly opposite to the rotating direction of the gyroscope. When f1 and f2 gradually exhaust a kinetic energy provided by the initial force, a common gyroscope will gradually slow down until it stops rotating.

However, in an embodiment of the present disclosure, not only the casing 1 and the output shaft 21 rotate together, but also the motor 2 drives the casing 1 to rotate relative to the output shaft 21. When the output shaft 21 gradually tends to be stationary relative to the rotating plane, f3 also tends to be equal to f1 gradually. In an embodiment, f3 is smaller than a maximum static friction force between the end of the output shaft 21 and the rotating plane, so that the output shaft 21 will not rotate on the rotating plane. But f4 will drive the casing 1 to rotate relative to the output shaft 21. At this time, only the air resistance f2 prevents the rotating of the casing 1, and f4 is greater than f2 to ensure that the casing can continue to rotate. Therefore, in an embodiment, the output shaft 21 does not rotate, and the motor 2 drives the casing 1 to rotate relative to the rotating plane and the output shaft 21.

In addition, the circuit board 31 is also provided with the current amplification circuit, and the plurality of tilt switches 33 are connected in series in the current amplification circuit. When the gyroscope is stationary, at least one tilt switch 33 is in the off state. At this time, the current amplification circuit is in the off state, and the power supply 32 is disconnected from the motor 2. When the gyroscope is rotated to provide the centrifugal force to the plurality of tilt switches 33, all the tilt switches 33 are turned on, so that the current amplification circuit is turned on, then the power supply 32 is connected to the motor 2. By setting the current amplification circuit, the current output by the power supply 32 can be amplified to meet the requirements of driving the motor 2, so that the motor 2 can be driven by a smaller power supply 32, which saves energy and cost. In other words, in a premise of the same power supply 32, the power supply 32 connected to the motor 2 with the current amplification circuit can drive the motor 2 with a higher power to work than the power supply 32 connected to the motor 2 without the current amplification circuit, which is conducive to provide a greater motivation to the rotating of the gyroscope. It should be noted that a rated current of the tilt switch 33 is sometimes smaller than the current required for the operation of the motor 2. If the current exceeds the rated current of the tilt switch 33, the tilt switch 33 will be easily damaged. When the current of the switch 33 is within its rated current, the motor 2 can also be driven to work through setting the current amplification circuit.

By combining the current amplification circuit and the plurality of tilt switches 33 according to the method of the solution of the present disclosure, it is possible to better control the on/off of the current amplification circuit.

In an embodiment, as shown in FIG. 1 and FIG. 2, FIG. 2 is a circuit connection view of a specific circuit. The current amplification circuit includes a Metal-Oxide-Semiconductor Field-Effect Transistor (MOS transistor) 34, a resistor 36 and a plurality of electrical connectors 35. It needs to be noted that the electrical connector 35 can be a wire or a copper sheet printed on the circuit board 31, which is not limited here. The MOS transistor 34 is provided with an N-channel MOS transistor 34 and a P-channel MOS transistor 34, and the N-channel MOS transistor 34 is used for illustration in this disclosure. In this embodiment, two tilt switches 33 are provided, which are respectively K1 and K2, and the two tilt switches 33 are connected in series. As shown in FIG. 1, two tilt switches 33 are arranged at intervals, and a gap between the two tilt switches 33 ensures that at least one of the two tilt switches 33 is disconnected when the gyroscope is stationary at any angle. For example, the two tilt switches 33 are provided in a straight line, and are arranged at an interval of 180° with the rotation axis of the gyroscope as the center.

A positive pole of the power supply 32 is electrically connected to a source S of the MOS transistor 34 through an electrical connector 35, one end of the tilt switch 33 connected in series is electrically connected to a gate G of the MOS transistor 34 through the electrical connector 35, and another end of the tilt switch 33 is electrically connected to a negative pole of the power supply 32 through the electrical connector 35. Two ends of the resistor 36 are respectively electrically connected to the positive pole of the power supply 32 and the gate G of the MOS transistor 34 through the electrical connector 35, and two electrodes of the motor 2 are respectively electrically connected to a drain D of the MOS transistor 34 and the negative pole of the power supply 32. Thus, a simple amplifying 10 circuit can be formed. When the gyroscope is not rotating, K1 and K2 are in an off state. By utilizing a property of the MOS transistor 34, an entire circuit is in an off state at this time, and the power supply 32 does not supply the power to the motor 2.

When the gyroscope is rotated, the two switches K1 and K2 are both connected, the drain D and the source S of the MOS transistor 34 are connected through a nature of the MOS transistor 34, and the entire circuit is connected. The power supply 32 supplies the power to the motor 2, and the current output by the power supply 32 can be amplified by the MOS transistor 34.

It should be noted that the current amplification circuit can also use triodes for amplifying, and the plurality of tilt switches 33 in series can also be provided in the amplification circuit using triodes for current amplifying to control the on/off of the amplification circuit. In other embodiments, there may be other types of current amplification circuits, which will not be repeated here. It needs to be clarified that no matter what kind of current amplification circuit is adopted, it is necessary to use the plurality of series-connected tilt switches 33 to jointly control the on/off of the circuit, and the plurality of tilt switches 33 can only be fully turned on when the gyroscope rotates, thereby amplifying the current.

In an embodiment, the power supply 32 is a rechargeable battery. A charging circuit electrically connected to the power supply 32 is provided on the circuit board 31, and a positive charging pin 311 is provided on the charging circuit, or a plurality of positive charging pins 311 are provided in parallel. A negative charging pin 312 is also provided on the charging circuit, or a plurality of negative charging pins 311 are provided in parallel.

It should be noted that there is no specific limit to a number of positive charging pins 311 and negative charging pins 312. For example, one positive charging pin 311 and one negative charging pin 312 can be provided, one positive charging pin 311 and a plurality of negative charging pins 312 can be provided, or a plurality of positive charging pins 311 and one negative charging pin 312 can be provided. When the plurality of positive charging pins 311 or negative charging pins 312 are provided, the plurality of positive charging pins 311 or the plurality of negative charging pins 312 are independent of each other and will not affect their respective functions, that is, one of the plurality of positive charging pins and one of the plurality of negative charging pins 312 can be selected to charge the power supply 32. In the present disclosure, one positive charging pin 311 and one negative charging pin 312 are set as an example for illustration.

A length direction of the positive charging pin 311 and a length direction of the negative charging pin 312 are perpendicular to a surface of the circuit board 31. The positive charging pin 311 and the negative charging pin 312 can be connected to an external charging current to charge the power supply 32. By setting the power supply 32 as the rechargeable battery, and by setting the positive charging pin 311 and the negative charging pin 312, the power supply 32 can be charged, so that the power supply 32 can be used repeatedly and frequent replacement of the power supply 32 is avoided.

In a specific embodiment, as shown in FIG. 1 to FIG. 4, the casing 1 includes an upper casing 11 and a lower casing 12, the upper casing 11 and the lower casing 12 are of regular shape, and the motor 2, the power supply 32 and the circuit board 31 are all installed on the lower casing 12. One end of the upper casing 11 is provided with a driving portion 111, and a rotating force around the rotation axis can be applied to the driving portion 111 to turn the gyroscope.

Another end of the upper casing 11 is provided with an accommodating chamber 112 that is opened away from the driving portion 111, and the lower casing 12 is detachably installed in the accommodating chamber 112.

It should be noted that one end of the lower casing 12 facing the driving portion 111 is provided with a placing groove 121 opened toward the driving portion 111, and the lower casing 12 is fixedly connected to the mounting member 13 in the placing groove 121. The mounting member 13 penetrates a mounting groove 131 from one end close to the driving portion 111 toward a direction away from the driving portion 111. A shape and a size of the mounting groove 131 are consistent with a shape and a size of the motor 2, so that the motor 2 can be plugged and fitted in the mounting groove 131. The output shaft of the motor 2 is arranged away from the driving portion 111, and the output shaft 21 passes through the lower casing 12 in a direction away from the driving portion 111.

One end of the mounting member 13 close to the driving portion 111 is provided with a plurality of openings. A peripheral wall of the motor 2 can extend out of the opening, so that fingers can be easily abutted against the peripheral wall of the motor 2 through the openings, and the motor 2 can be taken out from the mounting groove 131.

It is worth mentioning that a distance between the end of the mounting member 13 close to the driving portion 111 and the driving portion 111 is greater than a distance between the end of the lower casing 12 close to the driving portion 111 and the driving portion 111, so that a height difference is formed between the end of the mounting member 13 close to the driving portion 111 and the end of the lower casing 12 close to the driving portion 111.

In an embodiment, the height difference is set to be equal to a thickness of the circuit board 31, and an external dimension of the circuit board 31 is set to match the shape and size of a cross section of the placing groove 121. The circuit board 31 is placed in the placing groove 121 and is abutted against the end of the mounting member 13 close to the driving portion 111, and the end of the circuit board 31 away from the mounting member 13 is flush with the end of the lower casing 12 close to the driving portion 111.

In an embodiment, an outer wall of the lower casing 12 can be fixedly connected to the peripheral wall of the accommodating chamber 112 in an interference fit manner. Alternatively, two through grooves 122 arranged at intervals are penetrated on the outer wall of the end of the lower casing 12 close to the driving portion 111, the two through grooves 122 form two openings on the peripheral wall of the lower casing 12, and the two openings can cut the peripheral wall of the lower casing 1212 between the two through slots 122 to form a mounting plate 123. The end of the mounting plate 123 away from the driving portion 111 is integrated with the lower casing 12, other ends of the mounting plate 123 are separated from the lower casing 12, and a connecting protrusion 124 is provided at the end of the mounting plate 123 away from the placing groove 121. When the lower casing 12 is inserted into the accommodating chamber 112, the connecting protrusion 124 is abutted against a side wall of the accommodating chamber 112, and the mounting plate 123 is forced to deviate toward the mounting member 13. At this time, the mounting plate 123 is deformed and a pressure towards the side wall of the accommodating chamber 112 can be applied to the connecting protrusion 124 to make the connecting protrusion 124 and the side wall of the accommodating chamber 112 press against each other, thereby fastening the lower casing 12 and the upper casing 11.

In a specific embodiment, a plurality of fixing members 40 fixedly connected to the lower casing 12 are arranged between the peripheral wall of the lower casing 12 and the peripheral wall of the mounting member 13, and a number of the fixing members 40 is equal to the number of the positive charging pin 311, the negative charging pins 312. A position of the fixing member 40 needs to be set so that when the circuit board 31 is abutted on the mounting member 13, an arrangement of the fixing member 40 is consistent with an arrangement of the positive charging pins 311 and the negative charging pins 312 on the circuit board 31, that is, both the positive charging pin 311 and the negative charging pin 312 can be directly opposite to one fixing member 40. A through hole 401 is provided on the fixing member 40 in a direction perpendicular to the surface of the circuit board 31. An end of the through hole 401 away from the driving portion 111 penetrates the lower casing 12, and the positive charging pin 311 and the negative charging pin 312 are respectively plugged into the corresponding through hole 401 of the fixing member 40.

By setting the fixing member 40 and the through hole 401, the positive charging pin 311 and the negative charging pin 312 can be respectively inserted in the corresponding through hole 401. Both the positive charging pin 311 and the negative charging pin 312 can pass through the end of the through hole 401 away from the driving portion 111 to protrudes from the lower casing 12, so as to facilitate a connection with the external charging device.

In an embodiment, the lower casing 12 is provided with a locating member 125, and the circuit board 31 is provided with a locating groove 313 for plugging and fitting with a part of the locating member 125. It should be noted that a position of the locating member 125 in the lower casing 12 and a position of the locating groove 313 on the circuit board 31 need to be set according to a cooperation between the positive charging pin 311, the negative charging pin 312 and the fixing member 40. When the positive charging pin 311 and the negative charging pin 312 are inserted into the corresponding fixing members 40 respectively, the locating groove 313 and the locating member 125 are respectively arranged at a certain position between the circuit board 31 and the lower casing 12. In this way, when the circuit board 31 is installed, it only needs to align the locating groove 313 with the locating member 125, and the positive charging pin 311 and the negative charging pin 312 can be aligned with the through hole 401 of the corresponding fixing member 40, which is convenient for installation.

In an embodiment, the end of the output shaft 21 away from the motor 2 is arc-shaped, which is consistent with the common gyroscope, and is conducive to better rotating of the gyroscope.

In an embodiment, the end of the output shaft 21 away from the motor 2 is sleeved with a fulcrum sleeve 50, and an end of the fulcrum sleeve 50 away from the motor 2 is arc-shaped. It should be noted that the fulcrum sleeve 50 can be made of silica gel or rubber material, which has a relatively large friction coefficient, so that the fulcrum sleeve 50 has a relatively large static friction force with the rotating plane. In this way, when the gyroscope rotates, the output shaft 21 is relative stationary to the rotating plane, which ensures that the gyroscope can stably and continuously rotate.

In an embodiment, the circuit board 31 is with a centrally symmetrical shape such as a circle or a rectangle, the circuit board 31 is arranged laterally in the casing 1, that is, the rotation axis is perpendicular to the board surface of the circuit board 31, and the gravity center of the circuit board 31 lies on the rotation axis. Two or more tilt switches 33 connected in series are arranged at intervals around the rotation axis on the circuit board 31, and two adjacent tilt switches 33 are arranged according to a preset angle, so that when the gyroscope is stationary, at least one tilt switch 33 33 is disconnected. For example, if two tilt switches 33 are provided, an angle between the two tilt switches 33 can be set to 180°. If three tilt switches 33 are arranged, the angle between two adjacent tilt switches 33 can be set to 60°. Of course, when three or more tilt switches 33 are provided, these tilt switches 33 do not need to be arranged at equal intervals. It only need to ensure that at least one tilt switch 33 can be disconnected when the gyroscope is placed stationary.

Figure 5:
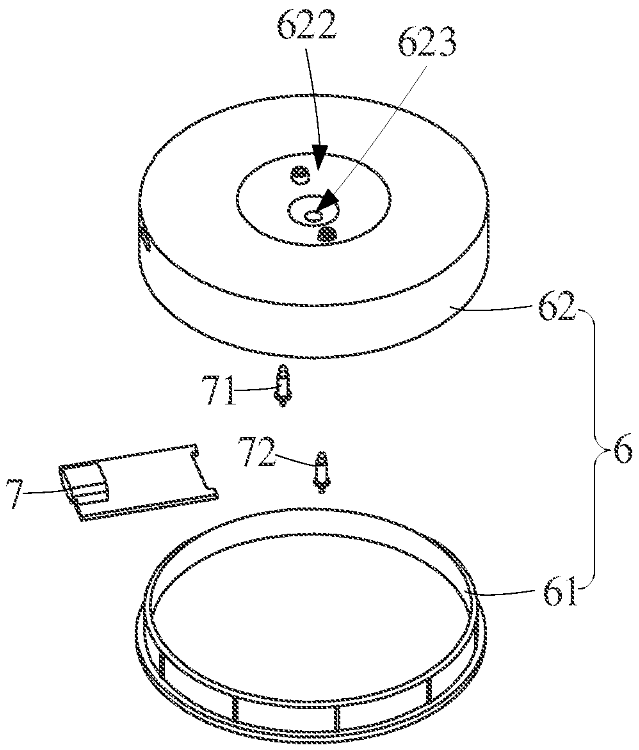
FIG. 5 is an exploded view of a charging device according to an embodiment of the present disclosure.
Figure 6:
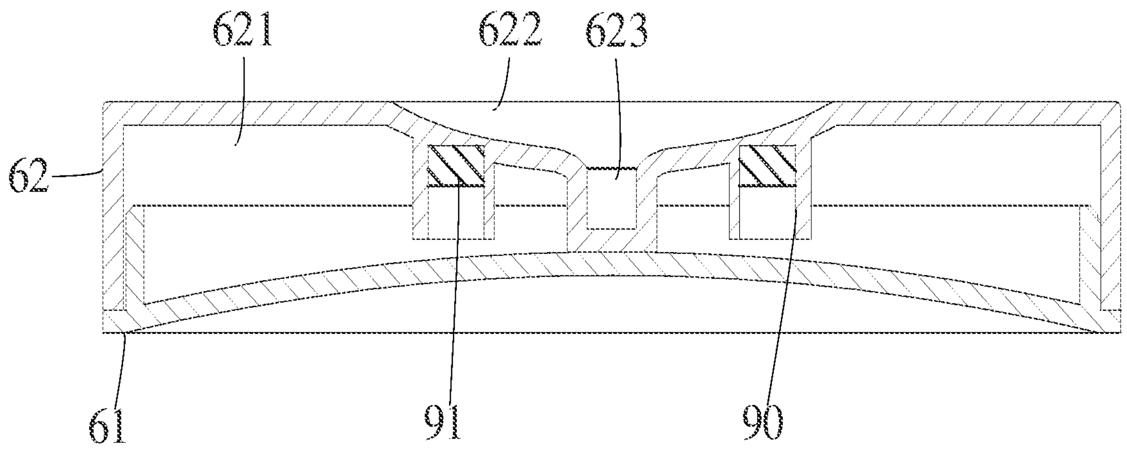
FIG. 6 is a sectional view of a charging device according to an embodiment of the present disclosure.
Figure 7:
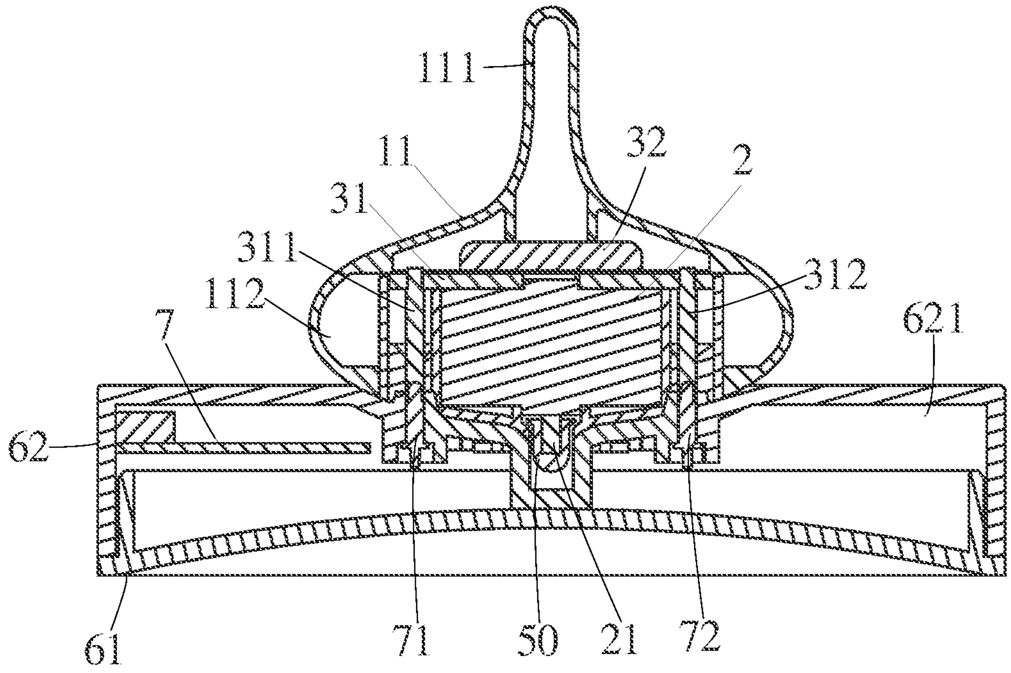
FIG. 7 is a sectional view of a combination of a gyroscope and a charging device according to an embodiment of the present disclosure.

The present disclosure also provides a charging device for charging the gyroscope. In an embodiment, as shown in FIG. 5 to FIG. 7, the charging device includes a supporting casing 6 for supporting the gyroscope. A charging board 7 is provided in the supporting casing 6, and the charging board 7 is provided with a positive contact pin 71 and a negative contact pin 72. The positive contact pin 71 and the negative contact pin 72 can be electrically connected to the positive charging pin 311 and the negative charging pin 312 respectively to form a charging circuit. When the charging board 7 is powered on, the power supply 32 can be charged through the charging circuit.

In an embodiment, the supporting casing 6 includes a bottom casing 61 and a top casing 62. One end of the top casing 62 is provided with an accommodating groove 621, the bottom casing 61 is fixedly connected to the top casing 62, and the bottom casing 61 is covered on an opening of the accommodating groove 621 to seal the accommodating groove 621.

One end of the top casing 62 away from the bottom casing 61 is recessed to form an abutting groove 622, and the end of the casing 1 close to the output shaft 21 can be fitted in the abutting groove 622. The top casing 62 is further provided with a receding groove 623 communicated with the abutting groove 622 on a bottom wall of the abutting groove 622 facing the output shaft 21, and the output shaft 21 can be inserted into the receding groove 623.

Both the positive contact pin 71 and the negative contact pin 72 are passed through in the top casing 62 and are arranged at a position where the abutting groove 622 is arranged. One end of the positive contact pin 71 and one end of the negative contact pin 72 both protrude from the bottom of the abutting groove 622 corresponding to a position where the positive charging pin 311 and the negative charging pin 312 pass through the lower casing 12, so that when the gyroscope is installed in the abutting groove 622, the positive contact pin 71 can abut against the positive charging pin 311, and the negative contact pin 72 can abut against the negative charging pin 312.

Figure 4:
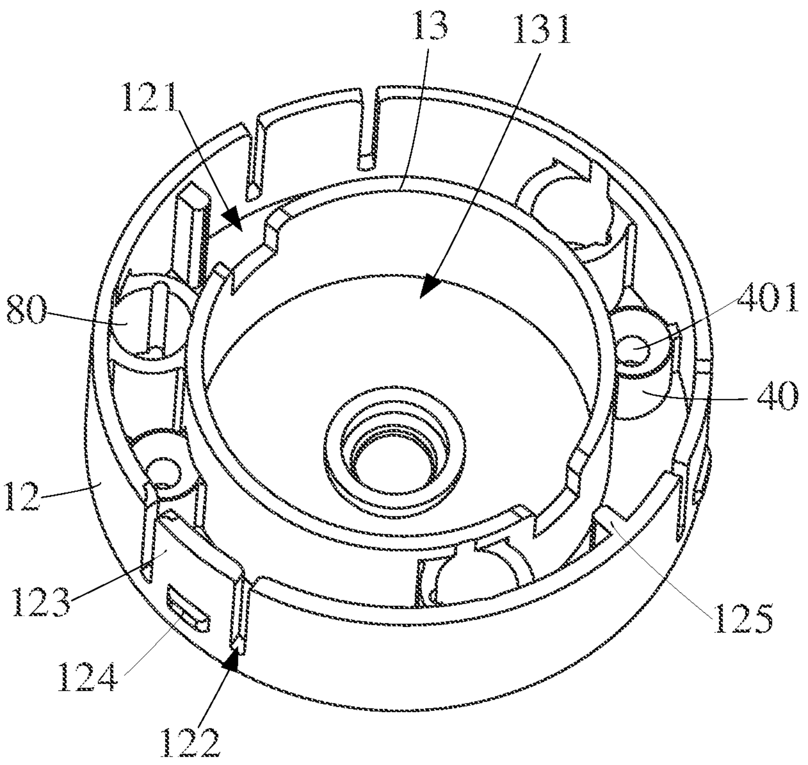
FIG. 4 is a schematic structural view of a lower casing of a gyroscope according to an embodiment of the present disclosure.

In an embodiment, as shown in FIG. 4, a plurality of first mounting portions 80 fixedly connected to the lower casing 12 are provided between the outer wall of the mounting member 13 and the inner wall of the lower casing 12. The first mounting portion 80 is hollow, and an end of the first mounting portion 80 away from the driving portion 111 is provided with a first magnet 81. One end of the top casing 62 away from the abutting groove 622 is provided with a plurality of second mounting portions 90 at a position of the first magnet 81. The second mounting portions 90 are hollow, and an end of the second mounting portion 90 close to the abutting groove 622 is provided with a second magnet 91.

When the gyroscope is placed in the abutting groove 622, the plurality of first magnets 81 can be arranged corresponding to the plurality of second magnets 91, and a mutual attraction between the first magnets 81 and the second magnets 91 makes the position of the gyroscope in the abutting groove 622 is relatively stable.

In an embodiment, as shown in FIG. 1 and FIG. 6, two first magnets 81 and two second magnets 91 are provided. One of the first magnets 81 is configured to attract one of the second magnets 91 and is configured to repel another one of the second magnets 91. Similarly, another one of the first magnets 81 is configured to repel one of the second magnets 91 and is configured to attract another one of the second magnets 91. In this way, the two first magnets 81 can attract the corresponding second magnets 91 and repel non-corresponding ones. Such arrangement enables the lower casing 12 and the top casing 62 to be connected in a directional manner.

In this way, by setting the positions of the positive contact pin 71, the positive charging pin 311, the negative contact pin 72 and the negative charging pin 312, an accurate alignment between the contacting needle and the charging needle can be achieved. Specifically, when the two first magnets 81 respectively correspond to the two second magnets 91, the positive contact pin 71 can be directly opposite to the positive charging pin 311, and the negative contact pin 72 can be directly opposite with the negative charging pin 312, so that the positive contact pin 71 can be quickly aligned with the positive charging pin 311 and the negative contact pin 72 can be quickly aligned with the negative charging pin 312.

Each technical feature of the embodiment can be combined arbitrarily, for making description succinct, all possible combinations of each technical feature in the embodiment are not all described. As long as the combination of these technical features does not contradict with each other, all should be deemed to be within the scope of the present disclosure.

The embodiments have only expressed several embodiments of the present disclosure, and the description is specific and detailed, but it cannot be interpreted as a limitation on the scope of the present disclosure. It should be noted that those skilled in the art can make several modifications and improvements without departing from the concept of the present disclosure, and these all belong to the scope of the present disclosure. Therefore, the scope of the present disclosure should be based on the appended claims.

What is claimed is:

1. A gyroscope, comprising:

a casing, wherein the casing is provided with a rotation axis, and a gravity center of the casing lies on the rotation axis;

a motor fixedly mounted on the casing, wherein an output shaft of the motor is coaxial with the rotation axis, an end of the output shaft away from the motor is located outside the casing, and the casing is rotatable around the rotation axis with the end of the output shaft away from the motor as a fulcrum;

a circuit board, wherein the circuit board is provided on the casing and is configured to move with the casing, the circuit board is provided with a power supply and a current amplification circuit, the motor is connected to the power supply through the current amplification circuit, so that a current output by the power supply is amplified by the current amplification circuit and delivered to the motor to control the motor to operate; and at least two tilt switches, wherein the at least two tilt switches are connected in series to the current amplification circuit for jointly controlling an on/off of the current amplification circuit, the at least two tilt switches are arranged at intervals on the circuit board, each tilt switch has an off state and an on state, when the gyroscope is stationary at any angle, at least one of the tilt switches is in the off state, and when the casing is rotated, all the tilt switches are in the on state.

2. The gyroscope of claim 1, wherein the current amplification circuit comprises a Metal-Oxide-Semiconductor Field-Effect (MOS) transistor, a plurality of resistors and a plurality of electrical connectors; and a positive pole of the power supply is electrically connected to a source of the MOS transistor through the electrical connector, one end of the plurality of tilt switches connected in series is connected to a gate of the MOS transistor through the electrical connector, another end of the plurality of tilt switches is connected to a negative pole of the power supply through the electrical connector, two ends of the resistor are respectively connected to the positive pole of the power supply and the gate of the MOS transistor through the electrical connector, and two poles of the motor are respectively connected to a drain of the MOS transistor and the negative pole of the power supply.

3. The gyroscope of claim 1, wherein the casing comprises an upper casing and a lower casing, one end of the upper casing is provided with a driving portion, another end of the upper casing is provided with an accommodating chamber away from an opening of the driving portion, the lower casing is detachably installed in the accommodating chamber, and the motor, the power supply and the circuit board are all mounted on the lower casing.

4. The gyroscope of claim 3, wherein one end of the lower casing facing the driving portion is provided with a placing groove facing the opening of the driving portion, the lower casing is provided with a mounting member fixedly connected in the placing groove, one end of the mounting member facing the driving portion is provided with a mounting groove facing the opening of the driving portion, the motor is installed in the mounting groove, the circuit board is provided in the placing groove and is abutted against an end of the mounting member close to the driving portion, and the output shaft passes through and protrudes from the lower casing.

5. The gyroscope of claim 4, wherein:

the power supply is a rechargeable battery, a positive charging pin is provided on the circuit board, or a plurality of positive charging pins are provided in parallel on the circuit board;

a negative charging pin is provided on the circuit board, or a plurality of negative charging pins are provided in parallel on the circuit board; and the positive charging pin and the negative charging pin are externally connected to a charging current to charge the power supply.

6. The gyroscope of claim 5, wherein a plurality of fixing members fixedly connected to the lower casing are arranged between a peripheral wall of the lower casing and a peripheral wall of the mounting member, a through hole is penetrated on the fixing member, one end of the through hole penetrates through the lower casing, and the positive charging pin and the negative charging pin are respectively plugged into one of the through holes.

7. The gyroscope of claim 6, wherein a locating member is provided in the lower casing, a locating groove for plugging and fitting with the locating member is provided on the circuit board, and the positive charging pin and the negative charging pin are inserted into the through hole through the cooperation of the locating member and the locating groove.

8. The gyroscope of claim 1, wherein the end of the output shaft away from the motor is arc-shaped, or the end of the output shaft away from the motor is provided with a fulcrum sleeve, and an end of the fulcrum shaft away from the motor is arc-shaped.

* * * * *